(12) United States Patent
Hotta et al.

(10) Patent No.: US 8,276,270 B2
(45) Date of Patent: Oct. 2, 2012

(54) METHOD FOR MANUFACTURING PRINTED CIRCUIT BOARD

(75) Inventors: Teruyuki Hotta, Osaka (JP); Shushi Morimoto, Osaka (JP); Takahiro Ishizaki, Osaka (JP); Hisamitsu Yamamoto, Osaka (JP)

(73) Assignee: C. Uyemura & Co., Ltd., Osaka (JP)

( * ) Notice: Subject to any disclaimer, the term of this patent is extended or adjusted under 35 U.S.C. 154(b) by 117 days.

(21) Appl. No.: 12/666,634

(22) PCT Filed: Apr. 22, 2008

(86) PCT No.: PCT/JP2008/057781
§ 371 (c)(1),
(2), (4) Date: Dec. 23, 2009

(87) PCT Pub. No.: WO2009/004855
PCT Pub. Date: Jan. 8, 2009

(65) Prior Publication Data
US 2010/0181104 A1    Jul. 22, 2010

(30) Foreign Application Priority Data
Jun. 29, 2007 (JP) ................. P2007-172133

(51) Int. Cl.
*H01K 3/10*    (2006.01)
(52) U.S. Cl. .......... 29/852; 29/830; 29/831; 29/846; 427/97.2; 427/98.1; 427/99.5; 427/443.1

(58) Field of Classification Search .......... 29/852, 29/830, 831, 846, 847, 853; 174/257–259, 174/263, 264, 266; 427/97.2, 98.1, 99.5, 427/443.1
See application file for complete search history.

(56) References Cited

U.S. PATENT DOCUMENTS 5,578,341 A * 11/1996 Hirosawa ................. 427/97.2
7,071,424 B1 * 7/2006 Shirai et al. ............... 174/263

FOREIGN PATENT DOCUMENTS

JP    10-247784    9/1998
JP    2002-252466 A    9/2002

\* cited by examiner

*Primary Examiner* — Thiem Phan
(74) *Attorney, Agent, or Firm* — Haverstock & Owens LLP (57) ABSTRACT

The present invention is directed to a method for manufacturing a printed circuit board in which a plurality of conductive layers forming a wiring pattern are laminated in the state where they are put between insulating layers, and a printed circuit board formed thereby. The printed circuit board manufacturing method for the present invention includes a step of forming a via fill (17) to allow electroless plating liquid to be in contact with the surface of the wiring pattern exposed to a bottom part of a via hole (14) formed at a insulating layer to laminate plating metallic film from the bottom part to a opening part of the via hole (14), to form the via fill (17), and a step of forming a wiring pattern to form electroless plating metallic film (20) serving as the wiring pattern onto a substrate where the via fill (17) is formed.

2 Claims, 3 Drawing Sheets

METHOD FOR MANUFACTURING PRINTED CIRCUIT BOARD

TECHNICAL FIELD

The present invention relates to a method for manufacturing a printed circuit board. More particularly to a printed circuit board manufacturing method for performing embedding of via hole in forming, by build-up process, the printed circuit board such as a multi-layered printed circuit board in printed circuit board or semiconductor package.

This application contains the subject matter related to the Japanese Patent Application JP 2007-172133 filed in the Japanese Patent Office on Jun. 29, 2007, the entire contents of which is incorporated herein by reference.

BACKGROUND ART

Following dramatical development of electronics industry, there is increased requirement of high density and high performance, and a demand therefor is greatly increased also with respect to printed circuit boards. Among them, in regard to manufacturing technology for multi-layered Printed Circuit Boards (PCBs), various devices for realization of high density are made.

Particularly, in manufacturing process for PCBs, a build-up process using copper as wiring material and using via hole as interlayer connection is focused at present.

The build-up process is directed to a method for manufacturing PCBs which comprises alternately laminating conductive layers and insulating layers, and performing interlayer connection by via therebetween. This build-up process is a method for filling inside of the via by metal using electroplating for the purpose of staking via of upper layer via on via with a view to realization of high density of wiring.

At present, as the build-up process using electro-plating, the semi-additive process and the full-additive process are used many times.

Figure 3:
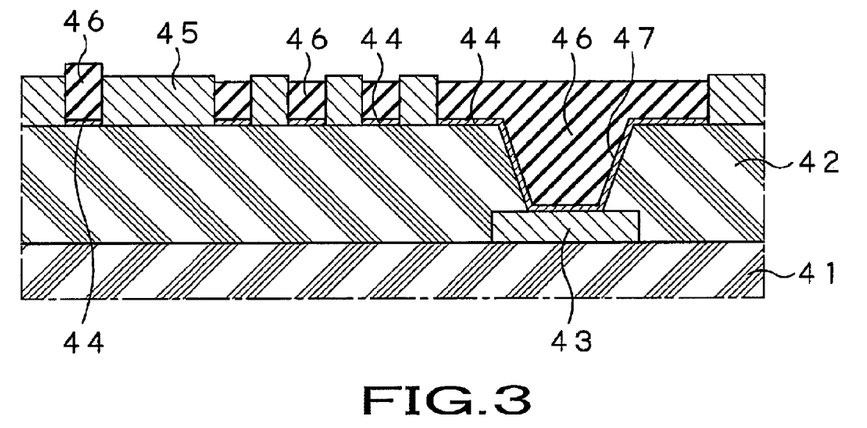
FIG. 3 is a cross sectional view of a circuit printed board formed by a manufacturing method in related art.

A cross sectional view of a printed circuit board formed by the semi-additive process is shown in FIG. 3. This semi-additive process is directed to a method for applying catalyst onto a substrate where via hole 47 is formed, forming an electroless plating film 44 as an underlying part for electric conduction of electro-plating, and performing embedding of the via hole 47 and formation of electro-plating film 46 as a wiring pattern by the electro-plating with plating resist 45 for allowing a part serving as the wiring pattern to be exposed being as mask.

Figure 4:
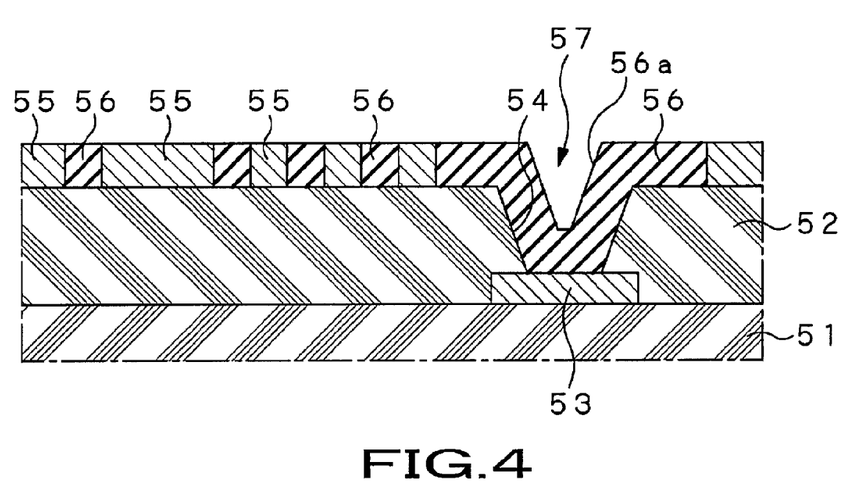
FIG. 4 is a cross sectional view of a printed circuit board formed by another manufacturing method in related art.

In addition, a cross sectional view of a printed circuit board formed by the full-additive process is shown in FIG. 4. This full-additive process is directed to a method for applying catalyst onto a substrate where via hole 54 is formed, allowing a part serving as the wiring pattern to be exposed by plating resist 55, and performing formation of a circuit including electroless plating film 56 only by electroless copper plating.

Non-Patent Literature 1:
"Uniform Precipitation Characteristic of Electroless Copper Plating onto Fine Via Hole" by Shinji Abe, Tomoyuki Fujinami, Takayuki Seino & Hideo Honma, Association of Surface Technology Vol. 148 No. 4. p433-438. (1997)
Patent Literature 1: Japanese Patent Application No. 1992-3676
Patent Literature 2: Japanese Patent Application Laid Open No. 1993-335713

DISCLOSURE OF THE INVENTION

Problems to be Solved by the Invention

However, as shown in FIG. 3, in accordance with the semi-additive process, since there takes place unevenness of film thickness of a circuit resulting from way of flow of electric current at the time of electro-plating so that a formed metallic circuit becomes coarse, it is required to perform, at all times, electro-plating process in which adjustment of current distribution is taken into consideration. Moreover, it is necessary to remove, by etching, electroless plating formed as underlying part of electric plating for electric conduction after electro-plating and breakage of wire of necessary circuit portions is apt to take place by such etching process. This problem more becomes conspicuous according as thinning is developed.

On the other hand, since the full-additive process is a method for forming a circuit only by electroless plating. Certainly there is no necessity in which current distribution which is regarded as important factor in the electro-plating is taken into consideration and there may not take place the possibility in which there takes place difference in thickness of a circuit resulting from way of flow of electric current in the semi-additive process. As a result, it becomes possible to form a printed circuit board having uniform film thickness distribution and there is also no problem of breakage of wire of circuit by etching. However, as shown in FIG. 4, in accordance with the full-additive process, since a plating film thickness distribution of printed circuit board becomes uniform, but entire plating film thickness including plating film 56a within the via hole 54 becomes uniform, it may be impossible to completely embed the via hole 54 so that a recessed part 57 would take place at the via hole 54. As a result, it is impossible to stack via of upper layer. While electroless plating which can completely embed via hole 54 is reported. In this case, via hole permitted be embedded has diameter of submicron (e.g., diameter of 0.5 μm) or less. This full-additive process is limited to semiconductor wafer. As a result, it is impossible to embed via hole with respect to printed circuit board having diameter of via hole of via hole of about several μm to 100 μm.

Even with the full-additive process, if the plating thickness is thickened, there may be cases where the via hole 54 can be embedded. However, in the case of thickness of several μm to ten several μm required for existing printed circuit board, it may be impossible to embed via hole by any means. As a result, film thickness is thickened in such way so that there would take place a problem in which an evenness takes place in film thickness.

In addition, in accordance with the full-additive process, there is also a problem in which film is formed by electroless plating onto a substrate where catalyst is applied so that growth of plating film takes place also from via hole inner wall where catalyst is applied. And whereby grown plating films are laminated in the vicinity of opening part of via hole, and void takes place in the vicinity of opening part the via hole 54, leading to causes of unsatisfactory electric conduction or breakage of wire to lower connecting reliability.

The present invention has been made in view of the above-mentioned circumstances, and aims at providing a method for manufacturing a printed circuit board in which there is no occurrence of void, via hole can be completely embedded by plating metal and the film thickness distribution is uniform.

To solve the above-mentioned problems, a method for manufacturing a printed circuit board according to an embodiment of the present invention is directed to a method for manufacturing a printed circuit board in which a plurality of conductive layers forming a wiring pattern are laminated with an insulting layer or layers being sandwiched and a portion or portions between the conductive layers is or are connected by a via fill or fills so that they electrically conduct to each other, the printed circuit board manufacturing method including: a step of forming a via fill to allow electroless plating liquid to be in contact with a surface of a wiring pattern exposed to a bottom part of a via hole formed at the insulating layer to laminate plating metallic film from the bottom part to a opening part of the via hole; and a step of forming a wiring pattern to form an electroless plating metallic film serving as the wiring pattern onto the substrate where the via fill is formed.

BEST MODE FOR CARRYING OUT THE INVENTION

A method for manufacturing a printed circuit board according to an embodiment of the application is directed to a method for manufacturing a printed circuit board in which a plurality of conductive layers forming wiring pattern are laminated with an insulting layer or layers being sandwiched and a portion or portions between the conductive layers is or are connected by a via fill or fills so that they electrically conduct to each other, the printed circuit board manufacturing method including: allowing electroless plating liquid to be in contact with a surface of the wiring pattern exposed to a bottom part of a via hole formed at the insulating layer to laminate a plating metallic film from the bottom part to a opening part of the via hole to form via fill; and wiring forming electroless plating metallic film serving as the wiring pattern onto a substrate where the via fill is formed.

Preferred embodiments of the present invention will now be described in detail with reference to the attached drawings.

Figure 1:
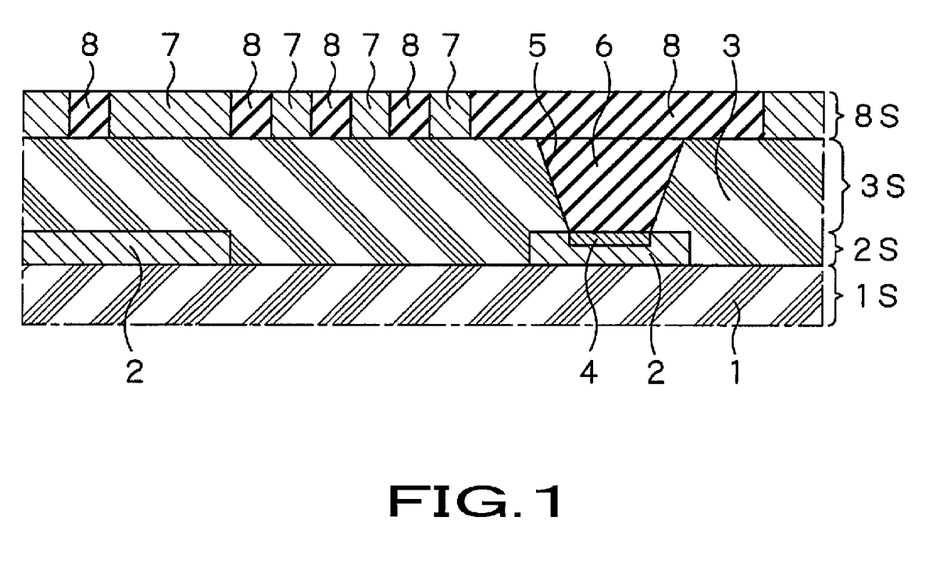
FIG. 1 shows an example of a cross sectional view of a printed circuit board formed by a manufacturing method according to an embodiment of the present application.

FIG. 1 shows an example of a cross sectional view of a printed circuit board formed by a manufacturing method board according to an embodiment of the application. As shown in FIG. 1, the printed circuit board includes a first insulating layer 1S, a first conductive layer 2S, a second insulating layer 3S and a second conductive layer 8S wherein respective layers are laminated with each other. Further, the first insulating layer 1S includes an inner layer resin 1 serving as base, and the first conductive layer 2S includes an inner layer metallic circuit (metallic land) 2 forming a wiring pattern, an insulating resin 3 for isolating portions between conductive layers forming the wiring pattern of the printed circuit board, and an activation region 4 corresponding to an exposed surface of the inner layer metallic circuit (metallic land) 2 and serving as starting point of electroless plating. Moreover, the second insulating layer 3S includes an insulating resin 3 for isolating portions between the conductive layers, and a via fill 6 where plating metal is embedded within a via hole 5. Further, the second conductive layer 8S includes a plating resist 7 for allowing a part serving as the wiring pattern to be exposed on a substrate, and an electroless plating metallic film 8 forming the wiring pattern formed by the electroless plating.

The inner layer resin 1 contains resin having electric insulating property, and has a structure in which the inner layer metallic circuit (metallic land) 2 serving as the wiring pattern is attached on the surface thereof to constitute the first insulating layer 1S. The inner layer resin 1 where the inner layer metallic circuit (metallic land) 2 is attached serves as a base substrate of the printed circuit board. It is to be noted that while the inner layer resin 1 may be caused to be a bottom surface (base) to laminate or layer layers only one side surface to form a multi-layered printed circuit board, insulating layer and conductive layer may be further laminated on both surfaces of the inner layer resin 1 to form the multi-layered printed circuit board. The resin used for the inner layer resin 1 is not particularly limited, but well known resins may be used. Similarly to resin of the insulating resin 3 which will be described later, various resins may be used.

The inner layer metallic circuit (metallic land) 2 is a metallic layer forming a inner layer wiring pattern of the multi-layered printed circuit board to constitute the first conductive layer 2S, and is formed on the inner layer resin 1 of the base layer by attachment or plating. As the metallic layer used for the inner layer metallic circuit (metallic land) 2, there may be used single layer or plural layers obtained by laminating metallic foil such as copper, aluminum, iron, nickel, chromium, molybdenum, etc., alloy foil of these materials, and copper alloy, e.g., aluminum bronze, phosphor bronze, bronze yellow, etc., stainless steel, amber, nickel alloy, or tin alloy, etc. In view of plating tightness, conductivity and cost, it is preferable to use copper or copper alloy.

The insulating resin 3 is positioned in the state where it is put between conductive layers forming the wiring pattern of the multi-layered printed circuit board, and serves to constitute the first conductive layer 2S and the second insulating layer 3S to isolate portions between the conductive layers. The insulating resin 3 is not particularly limited, but any well known insulating resin may be used. For example, there may be used various resins, e.g., epoxy resin (EP resin), polyimide resin (PI resin), bismaleimide-triazine resin (BT resin), polyphenylene ether (PPE resin), etc. serving as thermosetting resin film, and liquid crystal polymer (LCP), polyether ether ketone resin (PEEK resin), polyether imide resin (PEI resin) and polyether sulphone (PES resin), etc. serving as thermoplastic resin film. Alternatively, there may be used a plate material containing resin-resin compound material in which thermosetting resin such as EP resin, etc. is immersed into three-dimensional meshed furuolide resin base material such as continuous porous PTFE, etc. Further, flexible film, etc. may be used. Among these resins, as a particularly preferable resin, it is essential to use a material having tolerance to process such that there is no elution harmful to plating liquid at the time of electroless plating process and surface peeling does not takes place, etc., and having sufficient tightness with respect to layers of the circuit surface and upper and lower surfaces after curing is performed to form a circuit, the material being such being such that peeling or crack, etc. does not takes place at the test of cycle cryogenic.

The activation region 4 is a surface region exposed by forming the via hole 5 of the inner metallic circuit 2. The activation region 4 serves as starting point of electroless plating precipitation forming the via fill 6 and plating metals are embedded so that they are laminated from the activation region 4 serving as the bottom part of the via hole 5 toward a opening part of the via hole 5. In accordance with the manufacturing method according the embodiment, in plating embedding of the via hole 5, i.e., formation of the via fill 6, only the activation region 4 of the bottom part of the via hole 5 is caused to undergo activation process in the state where catalyst is not applied to the entirety of the via hole 5 including the bottom part and the inner wall and is filled by the electroless plating in plating embedding of via hole, i.e., via fill 6. In this example, the bottom part of the via hole 5 refers to the part where the inner layer metallic circuit 2 is exposed.

The activation treatment method for the activation region 4 is implemented in the state where acid solution and a substrate are caused to be in contact with each other. As the acid solution, there may be used the acid solution such as sulfuric acid, nitric acid, or hydrochloric acid, etc. However, in the case where copper foil is used as the inner layer metallic circuit 2, it is preferable to use solution having high oxidation characteristic like mixed solution containing persulfuric acid, sulfuric acid, or hydrogen peroxide. Further, a process of removing residual of oxide by using sulfuric acid of about 10% may be added. It is to be noted that the activation process may be performed by using processing liquid containing reductant such as formalin, etc., and processing liquid containing surface active agent such as polyether-processing liquid contains surface active agent such as containing compounds, etc.

The via fill 6 is an inter-conductor connecting material for electrically conducting the inner layer metallic circuit 2 formed by laminating plating metallic film into the via hole 5 formed at the second insulating layer 3S and forming the wiring pattern embedded within the resin layer of the inner layer, and the wiring pattern formed by the plating metallic film which will be described later. As described above, the via fill 6 is formed as the result of the fact that the electroless plating metallic films are embedded so that they are laminated from the bottom part of the via hole 5 toward the opening part thereof with the activation region 4 of the bottom part of the via hole 5 being as starting point without applying catalyst to the via hole 5, i.e., only by electroless plating liquid. While it is preferable to employ electroless copper plating from viewpoints of electric conductivity and plating tightness as electroless plating for forming the via fill 6, material of the electroless plating is not limited to the electroless copper plating. For example, the via fill 6 may be formed by using, e.g., electroless nickel plating having high stability of resin within plating liquid and excellent operability. As stated above, only the activation region 4 of the bottom part of the via hole 5 is caused to undergo acid process, etc., without applying catalyst to activate that region so that the plating metals are formed with they being filled from the bottom part toward opening part of the via hole 5. Accordingly, swelling based on overlap of plating metal does not take place at the via fill upper part and void which causes unsatisfactory electric conduction also does not take place in the embodiment of the present application, as compared to via fills formed by applying catalyst to the entirety also including a wall surface of the via hole 5. This point will be described later in detail.

A plating resist 7 is resist which exists between electroless plating metallic films 8 forming wiring pattern and serves to allow a portion serving as the wiring pattern to be exposed in the second conductive layer 8S. The plating resist 7 is formed as masking agent for masking a portion from which plating metal is not precipitated before electroless plating process after formation of the via fill 6. The plating resist 7 functions as solder resist after circuit formation and functions so that solder is not attached to a part where solder is unnecessary. The plating resist 7 is not particularly limited, but any well known plating resist may be used.

The electroless plating metallic film 8 is a metallic film formed by the electroless plating on a substrate where the plating resist 7 is pattened after the via fill 6 is formed. The electroless plating metallic film 8 contains plating metal precipitated toward a portion except for a portion where the plating resist 7 is formed, and forms the wiring pattern. The electroless plating metallic film 8 is formed by metallic film in which there is no unevenness of plating film thickness based on difference of current distribution followed by electroplating and the film thickness is uniform to form a circuit having no satisfactory electric conduction and connecting reliability.

Respective process steps of the printed circuit board manufacturing method will now be described with reference to FIGS. 2A to 2E. FIGS. 2A to 2E are views for schematically describing manufacturing process steps of the printing circuit board according to the embodiment of the application. It is to be noted that although only one surface is illustrated in respective views, the subject matter of the present invention does not exclude the case where process is implemented to surfaces of both sides. Moreover, an embodiment in which an inner layer copper circuit (copper land) is formed by using copper foil having excellent plating tightness as the inner layer metallic circuit 2 serving as the first conductive layer 2S, and copper circuit is formed by the electroless copper plating will be described in practical sense. It is to be noted that metal is not limited to copper, but implementation may be made by using various metals such as gold or nickel, etc. as described above.

Resin Layer Formation Process

First, the formation process of respective resin layers constituting layers of the multi-layered printed circuit board of an embodiment of the present application will be described. As shown in FIGS. 2A to 2E, a substrate 10 in the embodiment includes a resin base material as core material, and copper foil is formed as metallic layer therewithin. In concrete terms, there is formed a copper clad laminate 11 in which copper foil having thickness of several μm to 25 μm are overlapped on a surface of a inner layer resin serving as base to form the copper clad laminate 11 in which a copper land 13 forming a wiring pattern is attached. A resin base material 12 for isolating portions between conductive layers is overlapped on the copper clad laminate 11 to fix it by heating or pressing, etc., or by using additive, etc. to form resin layer. As the resin base material 12 forming insulating layer, there may be used epoxy resin, polyimide resin (PI resin) serving as a resin film, bis-maleimide-triazine resin (BT resin), liquid crystal polymer (LCP), PEEK resin, polyether imide resin (PEI resin), aramid resin etc. serving as a resin film, and a flexible film, etc. It is to be noted that the above-mentioned copper clad laminate 11 may be formed by plating copper foil onto the inner layer resin serving as the base.

Via Hole Formation and Plating Pre-Treatment

Figure 2A:
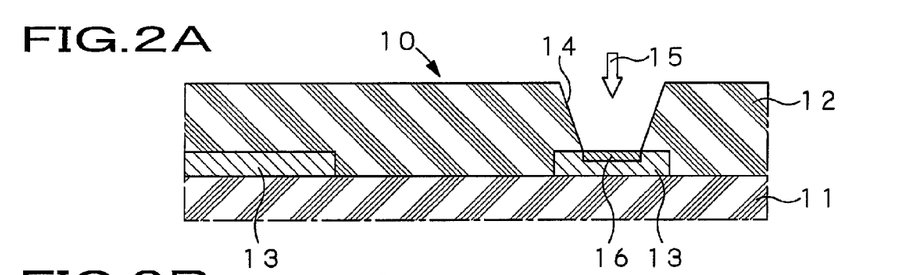
FIGS. 2A to 2E are views schematically explaining manufacturing process steps according to an embodiment of the present application.

Next, the copper land 13 serving as the wiring pattern is formed as the inner layer to laminate the resin base material 12 to form, as shown in FIG. 2A, the via hole 14 at the resin base material 12 with respect to the substrate 10 formed by laminating the resin base material 12. The via hole 14 is a via hole having a bottom part formed in a manner to allow the copper land 13 provided at the inner layer of the substrate as the wiring pattern to be exposed, and formed for filling metallic plating so that it electrically conducts to the copper land 13. The size of the via hole 14 is not limited to a value falling within a specified range in regard to aspect ratio, magnitude of diameter and depth, but the printed circuit board manufacturing method according to the embodiment can also comply with via hole having relatively large diameter, and particularly exhibits advantageous effects with respect to a via hole having relatively large diameter of 1 to 100 μm into which plating metal could not completely filled e.g., with the method in related. In accordance with the manufacturing method according to the embodiment of the application, since there is included a step of forming a via fill 17 for embedding copper plating films into the via hole 14 so that they are laminated, even in the case where there is employed the via hole 14 having large diameter of 1 to 100 μm, it is possible to form the printed circuit board in which copper plating can be completely, embedded thereinto so that unsatisfactory electric conduction and/or breakage of wire do not takes place.

The via hole 14 can be formed by using a laser 15. As kind of the laser 15, carbon gas laser or YAG laser may be used. In addition, there may be used argon laser or helium-neon laser serving as gas laser, sapphire laser serving as solid-state laser, excimer laser, pigment laser, semiconductor laser, and free electron laser, etc. It is desirable that such lasers may be changed depending upon size of a via hole to be formed. For example, in the case of forming fine hole, it is preferable to use YAG third harmonic, fourth harmonic and excimer laser having short wavelength of 400 nm or less. It is to be noted that the via hole may be used in place of laser. In addition, the via hole may be formed using a drill instead of the laser.

The via hole 14 is formed on the substrate 10 by the laser 15 to subsequently perform desmear treatment. The desmear treatment is performed with a view to removing resin smear or residual resin which has occurred at the time of formation of the via hole 14. As the desmear treating solution, there may be used well known treatment treating, e.g., mixture, etc. of alkaline permanganate, such as potassium permanganate, sodium hydroxide, ion exchange water, and the desmear treatment is implemented with the substrate 10 being immersed into the desmear treating solution for 10 to 20 min. under temperature condition of 50 to 80° C. As stated above, the resin smear or the residual resin which has occurred at the time of formation of the via hole 14 is removed, thereby making it possible to prevent unsatisfactory electric conduction and bad connectability between copper plating and the copper land 13 filled within the via hole 14, and breakage of wire, etc. It is to be noted that such desmear treatment may be physical desmear treatment using plasma or excimer laser.

Moreover, in the case where accumulator occurs within the via hole 14 by formation of the via hole 14, degassing treatment may be implemented as occasion demands. This degassing treatments is performed for the purpose of preventing obstacle of immerse of chemicals into the via hole 14 taking place by existing of the accumulator in the subsequent process.

After washing of desmear solution from the surface of the substrate 10, etc. is performed, neutralization treatment and degreasing treatment are implemented to the substrate 10 to perform cleaning of the surface of the copper land 13 at the bottom of the via hole 14, i.e., activation region 16. In concrete terms, neutralization treatment is implemented by immersing the substrate 10, e.g., for 5 min. at 45° C. within neutralization solution to neutralize the surface of the copper land 13. As such the neutralization solution, there may be used the neutralization solution, etc. containing sulfuric acid, hydroxylamine sulfate, activator, organic acid, and ion exchange water. The degreasing treatment is implemented by washing the substrate 10 immersed into the neutralization solution thereafter to immerse the substrate 10, e.g., for 5 min. at 65° C. within the degreasing treatment solution to remove oils and fats, etc. of surface of the copper land 13. As the degreasing solution, acid solution may be used, or alkaline solution may be used. By these treatments of the neutralization treatment and the degreasing treatment, the activation region 16 of surface of the exposed copper 13 is cleaned.

Next, the activation region 16 of the surface of the copper land 13 forming the exposed wiring pattern of the bottom part of the via hole 14 is activated. The activation treatment is performed with the substrate 10 being immersed for 5 to 10 sec. into acid solution by using acid solution, etc. containing 10% solution containing sulfuric acid or sodium acid. Although implementation may be performed by using 10% solution, etc. such as sulfuric acid or hydrochloric acid as acid solution, since copper is used as metal and copper land is formed as inner layer as conductive layer in the embodiment, it is preferable to process the substrate 10 by using mixed solution such as persulfate, sulfuric acid or hydrogen peroxide water, etc. Alkali which was left within the activation region 16 on the surface of the copper land 13 is activated by immersing (acid process) into acid solution in this way to have ability to dissolve thin acid film and to perform etching (soft etching) of the activation region 16 from which the oxide film has been removed. Thus, it is possible to improve tightness of copper plating film formed at the subsequent process to allow the activation region 16 to be placed in activated state. Further, the activated region 16 of the bottom part of the activated via hole 14 is caused to serve as embedding starting point of electroless copper plating subsequently performed. It is to be noted that the bottom part of via hole 14 refers to an exposed part of the copper land 13 in the via hole 14, even if, e.g., boring is implemented by a laser, etc., from a lower surface of the substrate so that the copper land 13 is positioned at a upper part.

While the above-mentioned process is the pre-treatment treatment of electroless plating process, the present invention is not limited to the above-described pre-processing, but different process may be employed as occasion demands. It is needless to say that that it is sufficient to change treatment time or concentration of chemicals depending upon kind of employed metal.

Formation of Via Fill

Figure 2B:
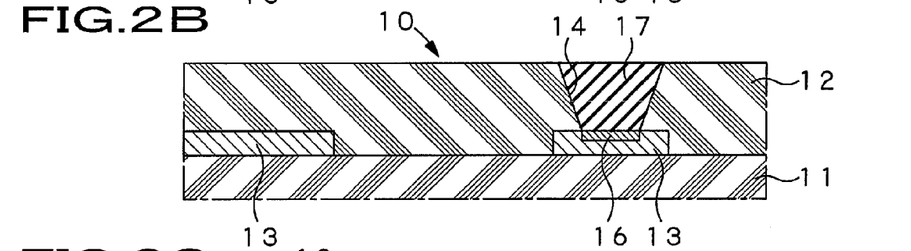

Next, as shown in FIG. 2B, copper plating is embedded into the via hole 14 with the activation region 16 of the surface of the copper land 13 to which pre-processing has been implemented being as starting point to form the via fill 17. Here, the via fill refers to via hole in the state where plating metal is filled so that plating metal is embedded therewithin.

Formation of the via fill 17 is performed by immersing the substrate 10 into the electroless copper plating liquid to thereby fill copper plating into the via hole 14. In this instance, copper plating is filled into the via hole 14 without applying catalyst, i.e., only by the electroless copper plating liquid to form the via fill 17. In concrete terms, the via hole 14 are filled in a manner to laminate copper plating from the bottom part toward opening part of via hole 14 with the activated region 16 of surface of the activated copper land 13 being as starting point to completely embed to form the via fill 17. It is to be noted that embedding of copper plating into the via hole 14 may be also performed in such a manner to spray, etc. the electroless copper plating liquid onto the activated region 16 to thereby allow the activated region 16 of the via hole 14 and the plating liquid to be in contact with each other so that plating metals are laminated from the bottom part toward the opening part of the via hole 14.

In accordance with the formation method for the via fill 17 in the printed circuit board manufacturing method according to the embodiment of the application, since only the electroless plating liquid is caused to be in contact with the entirety of the via hole 14 including the bottom part and the inner wall without applying catalyst, the plating film is grown only from the activated region 16 of the surface of the activated copper land 13. Growth of the plating film from the via hole inner wall to which catalyst has been applied as occurred in the method in related art can be eliminated by such growth of the plating film, thus making it possible to suppress occurrence of void resulting from overlap of the plating films in vicinity of opening part of the via hole. As the result thereof, it may be possible to eliminate unsatisfactory electric conduction or breakage of wire, etc. based on occurrence of the void thus to improve connecting reliability.

Moreover, since the copper plating is caused to be in contact with the portions within the bottom part of the activated via hole 14 by the electroless copper plating with respect to the substrate 10 to which catalyst is not applied as the first stage as stated above to form the via fill 17, it is possible to form the via fill 17 in which plating liquid is completely embedded within the via hole 14.

As copper plating liquid used for the electroless copper plating, e.g., plating liquid using EDTA as complexing agent may be used. As an example of composition of this copper plating liquid, there may be used electroless copper plating liquid in which at least copper sulphate (10 g/L) and EDTA (30 g/L) is contained, and adjustment is made such that pH is equal to 12.5 by sodium hydroxide. Moreover, electroless copper plating liquid using rochelle salt as a complexing agent may be used. Further, the substrate 10 is immersed into the electroless copper plating liquid for 30 to 600 min. under the temperature condition of e.g., 60 to 80° C. to precipitate copper in order so that copper layers are laminated from the bottom part toward the opening part the via hole 14 to form the via fill 17. It is to be noted that agitation of the liquid may be sufficiently performed in implementing this electroless copper plating so that ion supply is sufficiently performed into the via hole 14. As agitation method, there are methods such as air agitation or pump circulation, etc. In addition, in the case where plating is implemented for a long time, since there is the case where sodium phosphorate is accumulated within plating bath, leading to the cause of extraordinary precipitation of plating, a part of the plating liquid may be compulsorily discharged as occasion demand.

It is to be noted that implementation may be performed by using the electroless nickel plating as electroless plating as the described above. As composition of nickel plating liquid, there may be used the plating liquid solution containing at least nickel sulfate (20 g/L), sodium hypophosphite (15 g/L), or citrate (30 g/L) and adjustment is made such that pH becomes equal to 8 to 9.

Moreover, in the via fill 17 formation process, since the electroless copper plating is precipitated also toward portions except the via hole 14, various copper precipitation material removal processes may be performed as occasion demands after formation of the via fill 17. In concrete terms, it may be possible to remove copper as plating residual by performing processes of treatments such as the above-described desmear treatment, high pressure cleaning treatment to spray high pressure water of 50 to 70 kg/cm$^2$ from one surface or both surfaces of the substrate 10 to remove copper as plating residual, polishing process such as mechanical polishing performed by using brush or vibration, etc. or chemical polishing performed by using mixed solution of hydrogen peroxide, sulfuric acid and ammonium persulfate, etc.

Further, with a view to improving tightness between the electroless plating film formed in subsequent process and the surface of the substrate 10, coarsening process to allow the surface of the substrate 10 to be coarse may be performed after formation of the via fill 17 prior to the process which will be described below. Such coarsening process may be performed by making use of the coarsening process generally known.

Formation of a Circuit by Application of Catalyst and Electroless Copper Plating.

Figure 2C:
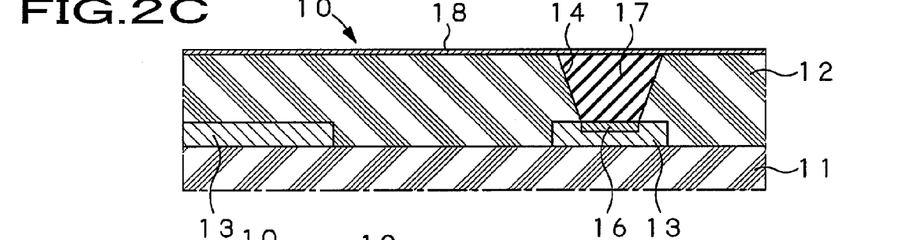

Next, as shown in FIG. 2C, catalyst 18 is applied to the substrate 10 on which the via fill 17 is formed is formed to precipitate and form the electroless copper plating film 20 forming the wiring pattern on the via fill 17 and the resin base material 12 as insulating layer.

First, it is preferable to use catalyst solution containing diavalent palladium ion (Pd$^{2+}$) as the catalyst 18 used in process for applying the catalyst. As catalyst solution, there may be employed, e.g., mixed solution containing palladium chloride (PdCl$_2$.2H$_2$O), stannous chlorade (SnCl$_2$.2H$_2$O) Tin, hydrochloric acid (HCl). As an example of catalyst solution concentration, there may be used catalyst 18 having concentration composition in which Pd concentration is 100 to 300 mg/L, Sn concentration is 10 to 20 g/L, and HCL concentration is 150 to 250 mL/L. Further, the substrate 10 is immersed into the catalyst solution for 1 to 3 min. e.g., under condition of temperature of 30 to 40° C. to first absorb Pd—Sn colloide onto the surface of the substrate 10. Next, the substrate 10 is immersed into accelerator (hastening agent) containing sulfuric acid or hydrochloric acid of 50 to 100 mL/L under normal temperature condition to perform activation of catalyst. By this activation process, Tin of complex compound is removed. As a result, palladium absorption particle is obtained. Finally, precipitation of copper by the electroless copper plating which will be implemented later as pallasium catalyst may be hastened. It is to be noted that sodium hydride or ammonium solution may be used as the accelerator. Further, it is to be noted that pre-treatment to firmly strengthen tightness between the resin base material 12 which is the insulating layer and the copper plating film by using conditioner liquid or pre-dip liquid may be implemented, and pre-treatment to hasten familiarity onto the surface of the substrate 10 may be implemented. It is further to be noted that the catalyst solution is not limited to solutions as described above, but implementation may be made by using catalyst solution containing Cu. In addition, catalyst solution of acid colloid type or alkali ion type which does not contain Tin may be used.

Figure 2D:
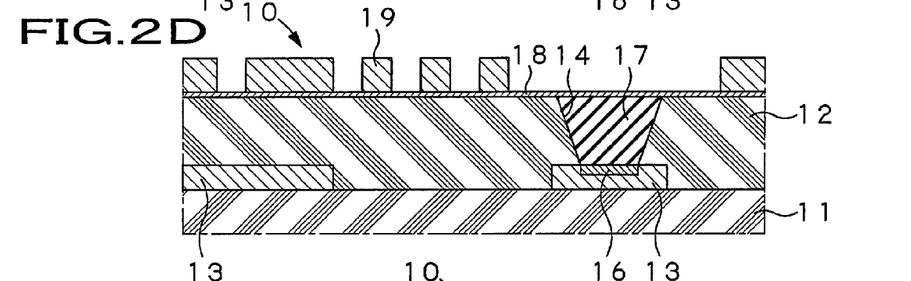

Next, the catalyst 18 is applied to the substrate 10 in this way thereafter to form a plating resist 19 to allow a portion serving as the wiring pattern to be exposed as shown in FIG. 2D. Namely, in the next step, there is formed resist pattern which masks portions except for those from which the electroless copper plating forming wiring pattern is precipitated. This resist pattern may be formed as solder-resist function without removal after plating process.

After the plating resist 19 is formed, potassium absorption particle of catalyst attached on the surface of the substrate is reduced and activated by using 10% sulfuric acid reducer to improve precipitation of the electroless copper plating on the substrate 10.

Figure 2E:
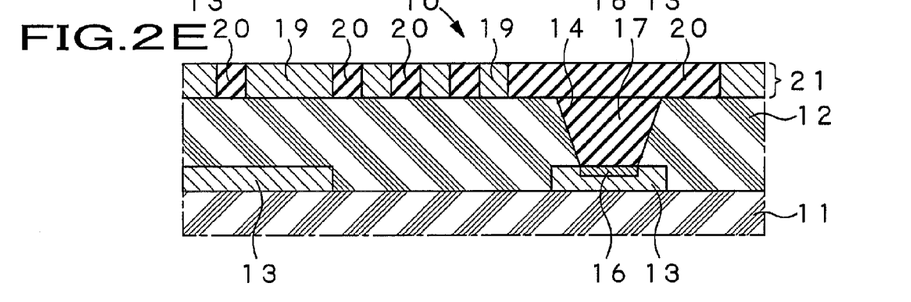

Further, as shown in FIG. 2E, the electroless copper plating film 20 serving as the wiring pattern where resist pattern is formed to form a wiring circuit containing copper. As copper liquid used for the electroless copper plating e.g., plating liquid using EDTA as complexing agent may be used. As the composition of the copper plating liquid, e.g., there may be used copper plating liquid containing copper sulfate (10 g/L), EDTA (30 g/L), and such adjustment is made so that PH becomes equal to 12.5 by sodium hydroxide. Further, the substrate 10 of this electroless copper plating liquid is immersed for about 20 to 300 min. at a temperature of 60 to 80° C. to form a circuit by the electroless copper plating film 20. It is to be noted that there may be used the electroless copper plating liquid using rocholle salt as the complexing agent. Selection of the complexing agent may be performed in accordance with the thickness of copper plating film to be precipitated.

It should be noted that, also in this electroless plating process, similarly to the electroless copper plating process in the above-described via fill 17 formation, agitation of plating liquid is sufficiently performed by air agitation or pump circulation, etc. Moreover, in the case where plating is implemented for a long time, a part of plating liquid may be compulsorily discharged as occasion demands in order to avoid extraordinary precipitation.

While the plating method for applying the catalyst 18 thereafter to form the resist 19 for allowing a portion serving as the wiring pattern to be exposed to precipitate the electroless copper plating has been described in the embodiment, the present invention is not limited to such plating method, but e.g., there may be employed an approach to directly coat catalyst or seed particle (metal such as gold or copper, etc.) in accordance with a ink jet system to form pattern to precipitate the electroless copper plating thereinto. In addition, portions except for seed pattern may be masked by using resist.

In accordance with the circuit formation method according to the embodiment, since circuit is formed on the substrate only by the electroless copper plating after formation of the via fill 17 by the electroless copper plating, it is possible to prevent unevenness of thickness of film (height of circuit) based on coarse or fine state, etc. of surface of copper circuit which is produced when the circuit is formed by electroplating as in related art. As a result, it is possible to form a circuit in which the film thickness distribution is uniform.

In addition, in accordance with the circuit formation method according to the embodiment of the application, the necessity of removing, by etching, underlying part for electric conduction containing the electroless plating film which was required in the case of the circuit formation by electro-plating is eliminated, thus making it possible to prevent breakage of wire by etching. Thus, it becomes possible to improve connecting reliability.

While the respective process steps have been described above, the substrate 10 shown in FIG. 2E formed via respective process steps corresponds to the printed circuit board shown in FIG. 1 and includes the copper clad laminate 11 constituting the insulating layer to serve as the base substrate, the copper land 13 constituting conductive layer to form the wiring pattern, the resin base material 12 for isolating portions between the conductive layers, the activation region 16 serving as starting point of lamination of copper plating in the via fill 17 formation, the via fill 17 is formed by embedding copper plating into the via hole 14 and for connecting portions between the conductive layers forming the wiring pattern so that they electrically conduct, the plating resist 19 constituting a part of copper plating layer 21 serving as conductive layer to allow a portion serving as the wiring pattern to be exposed, and the electroless copper plating film 20 for forming the wiring pattern in which copper is precipitated by the electroless copper plating.

Since the manufacturing method for printed circuit board according to the embodiment mainly includes, as stated above, a process of two stages of a step of forming the via fill 17 by the electroless plating and a step of forming the circuit of plating metal on the substrate 10 where the via fill 17 is formed by the electroless plating, it is possible to completely fill plating into the via hole 14 for electrical conductive connection. Thus, it becomes possible to manufacture the printed circuit board having the uniform film thickness in which there is no occurrence of the void so that connecting reliability has been improved and unsatisfactory electrical conduction and/or breakage of wire are prevented.

Further, as stated above, the printed circuit board in which there is no occurrence of the void and the film thickness is uniform is extremely advantageous to manufacturing of the printed circuit board for allowing high speed signal to flow, and provides technology complying with requirement of high density of the printed circuit board and flow of complexing agent.

It is to be noted that it may be possible to form the build-up multi-layered printed circuit board having a predetermined number of layers.

EXAMPLES

Practical examples of the present invention will now be described.

Example 1

Via hole was formed by using YAG laser on a build-up substrate containing a insulating layer and a conductive layer to remove accumulator within the via hole thereafter perform acid treatment in order to activate a surface of exposed inner layer copper land. In concrete terms, acid cleaner (Thru-cup MSC produced by C. Uyemura & Co., Ltd.) of and additive of sulfuric acid based etching (Thru-cup MSE produced by C. Uyemura & Co., Ltd.) were added under condition of 35 to 44° C. to immerse the substrate thus processed for a small time of about 10 sec. into 10% sulfuric acid.

After washing of the substrate in which the copper land was activated is performed, the substrate thus processed for about 600 min at 60 to 80° C. in full-additive electroless copper plating liquid (Thru-cup SP-2 produced by C. Uyemura & Co., Ltd.).

In order to firmly strengthen tightness between insulating resin base material and copper plating film, the surface of the substrate was processed by cleaner (Thru-cup ACL-009 produced by C. Uyemura & Co., Ltd.). Then, the substrate thus obtained was first immersed for 3 to 4 min. for the purpose of assisting absorption of Pd—Sn catalyst to further apply Pd—Sn catalyst (Thru-cup AT-105 produced by C. Uyemura & Co., Ltd.) to immerse such catalyst for 5 to 10 min. into accelerator (Thru-cup AL-106 by C. Uyemura & Co., Ltd.).

Next, a plating resist pattern from which a part serving as a wiring pattern was exposed was formed on a substrate to which catalyst is applied.

Further, Pd catalyst was activated on the substrate in which resist is formed by using acid cleaner (Thru-cup MSC and Thru-cup MSE produced by C. Uyemura & Co., Ltd.), 10% sulfuric acid and reducer (AL-cup reducer MAB produced by C. Uyemura & Co., Ltd.) reducer.

Thereafter, the resist pattern was formed by using full-additive electroless copper plating liquid (Thru-cup SP-2 produced by C. Uyemura & Co., Ltd.) to form a circuit only by the electroless copper plating on the activated substrate.

Comparative Example 1

Unlike the first example 1, in the comparative example 1, catalyst is applied on a substrate including via hole to form electroless plating film serving as underlying part for electric conduction to form a resist pattern thereafter to form a circuit by electroless copper plating in a manner to perform embedding of the via hole.

Namely, the via hole was formed by YAG laser on build-up substrate containing a insulating layer and a conductive layer thereafter to perform treatment of surface of the substrate by cleaner (Thru-cup ACL-009 produced by C. Uyemura & Co., Ltd.) to immerse the surface of the substrate for 3 to 4 min. by pre-dip liquid (Thru-cup RED-104 produced by C. Uyemura & Co., Ltd.) to apply Pd—Sn catalyst (Thru-cup AT-105 produced by C. Uyemura & Co., Ltd.). Thereafter, the substrate was immersed for 5 to 10 min. into accelerator (Thru-cup AL-106 produced by C. Uyemura & Co., Ltd.) to perform a process for applying catalyst.

Next, the substrate to which the catalyst has been applied was immersed for 30 min. into semi-additive electroless copper plating liquid, (Thru-cup PEA produced by C. Uyemura & Co., Ltd.) in which rochelle salt is used as complexing agent to form the electroless copper plating film serving as underlying part for electric conduction of electro-plating.

Further, plating resist pattern was formed on the electroless plating film to immerse the substrate into electro-copper plating liquid (Thru-cup EVF produced by C. Uyemura & Co., Ltd.) to perform electro-plating to perform circuit formation.

It is to be noted that the electroless plating film at the part where resist is formed is removed by etching.

Comparative Example 2

In the comparative example 2, unlike the example 1, after catalyst is applied on a surface of substrate including the via hole, there is formed a circuit containing electroless copper film on the surface of the substrate including the via hole by using electroless copper plating liquid.

Namely, the via hole was formed similarly by YAG laser on build-up substrate containing a insulating layer and a conductive layer to process the surface of the substrate by cleaner (Thru-cup ACL-009 produced by C. Uyemura & Co., Ltd.) thereafter to immerse the substrate thus processed for 3 to 4 min. by pre-dip liquid (Thru-cup PED-104 produced by C. Uyemura & Co., Ltd.) to apply Pd—Sn catalyst (Thru-cup AT produced by C. Uyemura & Co., Ltd.) thereafter to immerse the substrate thus processed for 5 to 10 min. into accelerator (Thru-cup AL-106 produced by C. Uyemura & Co., Ltd.) to perform a process for applying catalyst.

Next, plating resist pattern serving as a wiring pattern was formed on the substrate to which the catalyst has been applied thereafter to activate Pd catalyst by using acid cleaner (Thru-cup MSC produced by C. Uyemura & Co., Ltd.) and (Thru-cup MSE produced by C. Uyemura & Co., Ltd.), and 10% sulfuric acid and reducer (Thru-cup MAB produced by C. Uyemura & Co., Ltd.).

Further, a circuit was formed only by electroless copper plating by using full-additive electroless copper plating liquid (Thru-cup SP-2 produced by C. Uyemura & Co., Ltd.) on the substrate where the catalyst has been activated.

The film thickness measurement, embedding states of the via hole were respectively examined with respect to the respective printed circuit boards obtained by the example 1 and the comparative examples 1 and 2. In this case, the film thickness measurement was performed by using fluorescent X-ray Micro film thickness meter (SII-nanotechnology Company), and the embedding states of the via hole and occurrence state of void were observed and examined at the cross section.

TABLE 1

| | Plating film thickness | Embedding of via hole | Presence/absence of void |
|---|---|---|---|
| Example 1 | 20 ± 1 μm | ◯ | ◯ |
| Comparative Example 1 | 20 ± 3 μm | ◯ | X occurrence of void |
| Comparative Example 2 | 20 ± 1 μm | X unsatisfactory embedding | X occurrence of void |

In Table 1, "◯" indicates that there is no occurrence of the void in regard to the examination of 'presence/absence of the void'. Moreover, "◯" in the Table indicates that plating film has been completely embedded within the via hole in regard to the examination of 'embedding of via hole'.

As apparent from the result of the Table 1, in the case of the printed circuit board formed by the example 1 to which the manufacturing method according to the embodiment of the application has been applied, a circuit having uniform plating film thickness was formed. Moreover, the via hole was completely embedded by copper plating so that there is no occurrence of void by any means.

On the contrary, as indicated by the comparative example 1, in the printed circuit board formed by the method in related art, via hole could be completely embedded into the via hole, whereas the plating film thickness became uniform so that the void which causes influence of wire breakage, etc. took place. Further, in the printed circuit board formed by the method in related art indicated by the comparative example 2, while uniformness of plating film thickness could be maintained, plating was not completely embedded, and occurrence of the void was also observed.

From this fact, in accordance with the manufacturing method for the printed circuit board according to the embodiment, unlike methods in related art, it has become clear that plating metal can be completely embedded within the via hole so that the printed circuit board having uniform film thickness can be formed without occurrence of the void.

The present invention is not limited to the above-described embodiments, but design change, etc., within the scope which does not depart from the gist of the present invention is also included in the present invention.

In addition, the present invention is applied only to the printed circuit board according to the above-described embodiments, and manufacturing method for high density multi-layered printed circuit board by the build-up process, but is also applied to manufacturing process for the multi-layered printed circuit board, e.g., wafer level CSP (Chip Siz epoxy ackage or Chip Scal epoxy package), or TCP (Tape Carrier Package), etc.

As described above, in accordance with the printed circuit board manufacturing method according to the embodiment of the present invention, since there is included the via fill formation process step of filling plating metal into the via hole by electroless plating, it is possible form the via fill in which metal is completely filled by plating. In addition, since circuit is formed thereafter only by electroless plating, it is possible to manufacture the printed circuit board having uniform film thickness.

It should be understood by those skilled in the art that various modifications, embodiments, sub-combinations and alterations may occur depending on design requirements and other factors insofar as they are within the scope of the appended claims or the equivalents thereof.

The invention claimed is:

1. A method for manufacturing a printed circuit board in which a plurality of conductive layers forming wiring pattern are laminated with an insulting layer or layers being sandwiched and a portion or portions between the conductive layers is or are connected by a via fill or fills so that they electrically conduct to each other, the printed circuit board manufacturing method including:

a step of forming a via fill to allow electroless copper plating liquid to be in contact with a surface of a wiring pattern exposed to a bottom part of a via hole formed at the insulating layer to laminate copper plating metallic film from the bottom part to an opening part of the via hole without applying catalyst; and a step of forming a wiring pattern to form electroless plating metallic film serving as the wiring pattern onto a substrate where the via fill is formed by the electroless copper plating, wherein the step of forming the wiring pattern comprises applying a palladium catalyst on the substrate, forming a resist pattern, and then reducing and activating the palladium catalyst.

2. The method for manufacturing printed circuit board according to claim 1, wherein the diameter of the via hole is 1 to 100 μm.

* * * * *